(12) United States Patent
Lee et al.

(10) Patent No.: US 12,048,187 B2
(45) Date of Patent: Jul. 23, 2024

(54) DISPLAY PANEL AND ELECTRONIC DEVICE

(71) Applicant: Samsung Display Co., Ltd., Yongin-Si (KR)

(72) Inventors: Wonse Lee, Yongin-si (KR); Okkyung Park, Yongin-si (KR); Sukyoung Kim, Yongin-si (KR); Donghyeon Jang, Yongin-si (KR); Yujin Jeon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 484 days.

(21) Appl. No.: 17/486,360

(22) Filed: Sep. 27, 2021

(65) Prior Publication Data

US 2022/0158127 A1 May 19, 2022

(30) Foreign Application Priority Data

Nov. 17, 2020 (KR) .................... 10-2020-0154088

(51) Int. Cl.
*H10K 50/844* (2023.01)
*H10K 59/121* (2023.01)
*H10K 59/131* (2023.01)
*H10K 59/65* (2023.01)

(52) U.S. Cl.
CPC ......... *H10K 50/844* (2023.02); *H10K 59/121* (2023.02); *H10K 59/131* (2023.02); *H10K 59/65* (2023.02)

(58) Field of Classification Search
CPC .... H10K 50/844; H10K 59/65; H10K 59/121; H10K 59/131
See application file for complete search history.

(56) References Cited

U.S. PATENT DOCUMENTS

| | | | |
|---|---|---|---|
| 2019/0101758 A1* | 4/2019 | Zhu | G06T 3/00 |
| 2019/0189974 A1* | 6/2019 | Gunji | H10K 59/1216 |
| 2019/0198587 A1* | 6/2019 | Park | H10K 50/84 |
| 2019/0206330 A1* | 7/2019 | Kim | G09G 3/3283 |
| 2019/0252475 A1 | 8/2019 | Sung et al. | |
| 2020/0124910 A1 | 4/2020 | Hwang et al. | |
| 2020/0350301 A1* | 11/2020 | Zhai | H10K 59/126 |
| 2020/0359499 A1* | 11/2020 | Hwu | H10K 59/131 |

FOREIGN PATENT DOCUMENTS

| | | |
|---|---|---|
| CN | 109119446 A | 1/2019 |
| CN | 109188787 A | 1/2019 |
| CN | 109856849 A | 6/2019 |
| KR | 10-1603145 B1 | 3/2016 |
| KR | 10-2019-0098703 A | 8/2019 |
| KR | 10-2020-0003334 A | 1/2020 |
| KR | 10-2020-0046222 A | 5/2020 |

* cited by examiner

*Primary Examiner* — Thai Q Tran
*Assistant Examiner* — Jose M Mesa
(74) *Attorney, Agent, or Firm* — Innovation Counsel LLP

(57) ABSTRACT

A display panel includes a substrate, a plurality of pixels arranged on the substrate in a display area that surrounds a transmissive area, a first insulating layer arranged on the substrate and including an opening that overlaps the transmissive area, a second insulating layer arranged on the first insulating layer and including a groove, an encapsulation substrate covering the plurality of pixels, and a filling layer arranged between the substrate and the encapsulation substrate in the transmissive area and overlapping the groove.

20 Claims, 9 Drawing Sheets

DISPLAY PANEL AND ELECTRONIC DEVICE

CROSS-REFERENCE TO RELATED APPLICATION

This application claims priority under 35 U.S.C. § 119 to Korean Patent Application No. 10-2020-0154088, filed on Nov. 17, 2020, in the Korean Intellectual Property Office, the disclosure of which is incorporated by reference herein in its entirety.

BACKGROUND

1. Field

The present disclosure relates to a display panel and an electronic device including the same.

2. Description of Related Art

Recently, various types of display panels have been developed and used for different purposes and applications. As the display panels become thinner and lighter, the range of their applications is widened.

Various functions linked to or associated with the display panel may be added in a display area of the display panel. Research is being conducted to utilize a part of a display area that displays an image to impart some functions linked to or associated with the display panel.

SUMMARY

The present disclosure relates to a display panel including at least one transmissive area located inside a display area, a method of manufacturing the display panel, and an electronic device including the display panel.

Additional aspects of the present disclosure will be set forth in part in the detailed description which follows and, in part, will be apparent from the detailed description, or may be learned by practice of the one or more embodiments presented herein.

According to one embodiment, a display panel includes a substrate, a plurality of pixels arranged on the substrate in a display area that surrounds a transmissive area, a first insulating layer arranged on the substrate and including an opening that overlaps the transmissive area, a second insulating layer arranged on the first insulating layer and including a groove, an encapsulation substrate covering the plurality of pixels, a filling layer arranged between the substrate and the encapsulation substrate in the transmissive area and overlapping the groove.

A depth of the groove may be less than a thickness of the second insulating layer.

The display panel may further include a plurality of data lines electrically connected to the plurality of pixels, wherein at least one of the plurality of data lines may include a bypass portion that bypasses a periphery of the transmissive area, and wherein the bypass portion may be located under the groove.

The display panel may further include a conductive layer that overlaps the bypass portion, wherein the groove may overlap the conductive layer.

A refractive index difference between the filling layer and at least one selected from the substrate and the encapsulation substrate may be 0.4 or less.

The filling layer may include a silicon-based adhesive material.

Each of the plurality of pixels may include a first electrode, an intermediate layer arranged on the first electrode, and a second electrode, wherein at least a part of the second electrode may cover the plurality of pixels.

The display panel may further include an upper insulating layer that covers an edge of the first electrode of the light-emitting diode, wherein the upper insulating layer may include a first opening that overlaps the first electrode and a second opening that overlaps the transmissive area, and wherein an edge of the upper insulating layer defining the second opening may be closer to the light-emitting diode than the groove.

The display panel may further include an auxiliary partition wall located on both sides of the groove of the second insulating layer.

The auxiliary partition wall may include a same material as a material of the upper insulating layer.

According to one embodiment, an electronic device includes a display panel including a transmissive area and a display area that surrounds the transmissive area, and a component located under the transmissive area of the display panel, wherein the display panel includes a substrate, a plurality of pixels arranged on the substrate in the display area, a first insulating layer arranged on the substrate and including an opening that overlaps the transmissive area, a second insulating layer arranged on the first insulating layer and including a groove, an encapsulation substrate covering the plurality of pixels, and a filling layer arranged between the substrate and the encapsulation substrate in the transmissive area and overlapping the groove.

A depth of the groove may be less than a thickness of the second insulating layer.

The display panel may further include a plurality of data lines electrically connected to the plurality of pixels, wherein at least one of the plurality of data lines may include a bypass portion that bypasses a periphery of the transmissive area, and wherein the bypass portion may be located under the groove.

The display panel may further include a conductive layer that overlaps the bypass portion, wherein the groove may overlap the conductive layer.

The filling layer may include a silicon-based adhesive material.

Each of the plurality of pixels may include a light emitting diode, and the light emitting diode may include a first electrode, an intermediate layer arranged on the first electrode, and a second electrode, wherein at least a part of the second electrode may cover the plurality of pixels, and wherein the display panel further includes an upper insulating layer that covers an edge of the first electrode of the light-emitting diode.

The display panel may further include an auxiliary partition wall located on both sides of the groove of the second insulating layer.

The upper insulating layer may include a first opening that overlaps the first electrode and a second opening that overlaps the transmissive area, and wherein an edge of the upper insulating layer defining the second opening may be closer to the display area than the auxiliary partition wall.

Each of the groove and the auxiliary partition walls may have a closed loop shape surrounding the transmissive area in a plan view.

The component may include a sensor or a camera.

Other features and advantages of the present disclosure will become more apparent from the drawings, the detailed description, and the claims provided herein.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
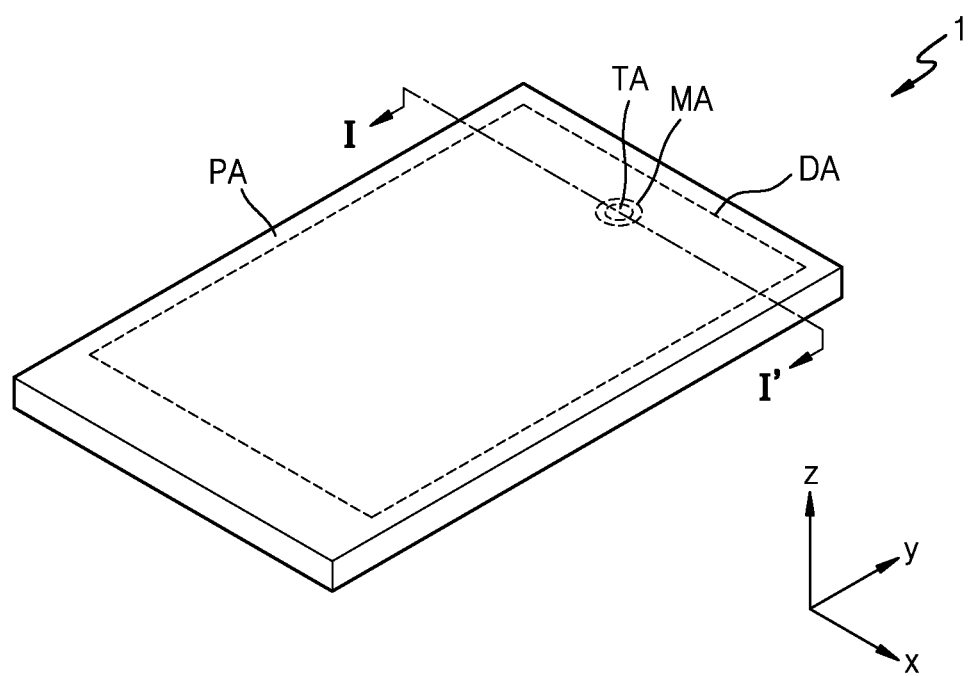
FIG. 1 is a perspective view of an electronic device according to an embodiment.

Reference will now be made in detail to one or more embodiments of the present disclosure, examples of which are illustrated in the accompanying drawings, wherein like reference numerals refer to like elements throughout. In this regard, the one or more embodiments presented herein may have different forms and should not be construed as being limited to the descriptions of the embodiments set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or any variations thereof.

"A and/or B" is used herein to select only A, select only B, or select both A and B. "At least one of A and B" is used herein to select only A, select only B, or select both A and B.

As the present disclosure allows for various changes and intends to cover numerous embodiments, some embodiments will be illustrated in the drawings and described in the detailed description. Effects and features of the present disclosure, and methods for achieving them will be clarified with reference to the embodiments described below in detail with reference to the drawings. However, the present disclosure is not limited to the following embodiments and may be embodied in various forms and/or configurations.

Hereinafter, the following embodiments will be described in detail with reference to the accompanying drawings, wherein the same or corresponding elements are denoted by the same reference numerals throughout, and a repeated description thereof is omitted.

Although the terms "first," "second," etc. may be used to describe various elements, these elements should not be limited by these terms. These terms are merely used to distinguish one element from another.

As used herein, singular forms such as "a," "an," and "the" are intended to include plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with one or more intervening layers, regions, or components therebetween.

Sizes of elements in the drawings may be exaggerated or contracted for convenience of description. For example, sizes and thicknesses of elements in the drawings are arbitrarily illustrated for convenience of description, and the present disclosure is not limited thereto.

While the present disclosure may describe a specific process order for implementing layer, region, or component according to one embodiment, the specific process order may deviate from the described order in another embodiment. For example, two consecutively described processes may be performed substantially at the same time or performed in an order opposite to the described order.

It will be understood that when a layer, region, or element is referred to as being "connected," the layer, the region, or the element may be directly connected or may be indirectly connected with one or more intervening layers, regions, or elements therebetween. For example, when layers, areas, or elements are referred to as being "electrically connected," the layers, the areas, or the elements may be directly electrically connected, or may be indirectly electrically connected with one or more intervening layers, areas, or elements therebetween.

FIG. 1 is a perspective view of an electronic device according to an embodiment.

Referring to FIG. 1, an electronic device 1 for displaying an image (e.g., a moving image or a still image) may correspond to a display screen of a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC) or any of various products such as a television, a laptop computer, a display monitor, an advertisement board, or an Internet of things (IoT) product. The electronic device 1 according to an embodiment may be implemented in a wearable device such as a smart watch, a watch phone, a glasses-type display, or a head-mounted display (HMD). Also, the electronic device 1 according to another embodiment may be used as a center information display (CID) located on an instrument panel, a center fascia, or a dashboard of a vehicle, a mirror display replacing a side-view mirror of a vehicle, or a display of an entertainment system located on the back of a front seat for backseat passengers in a vehicle. For convenience of description, FIG. 1 illustrates the electronic device 1 according to an embodiment of a smartphone.

The electronic device 1 may have a rectangular shape in a plan view. For example, the electronic device 1 may have a rectangular planar shape having a short side in an x direction and a long side in a y direction as shown in FIG. 1. An edge where the short side in the x direction and the long side in the y direction meet each other may be round to have a curvature or formed to have a right angle. A planar shape of the electronic device 1 is not limited to a rectangular shape, and the electronic device 1 may have a different shape, including but not limited to, polygonal shape, an elliptical shape, or an irregular shape.

The electronic device 1 may include a transmissive area TA (or a first area) and a display area DA (or a second area) at least partially surrounding the transmissive area TA. The electronic device 1 may include an intermediate area MA (or a third area) located between the transmissive area TA and the display area DA, and a peripheral area PA (or a fourth area) located outside the display area DA, for example, surrounding the display area DA.

The transmissive area TA may be located inside the display area DA. In one embodiment, the transmissive area TA may be located in an upper middle portion of the display area DA as shown in FIG. 1. In another embodiment, the transmissive area TA may be located in various locations with respect to the display area DA. For example, the transmissive area TA may be located in an upper left portion of the display area DA or an upper right portion of the display area DA. In the specification, "left," "right," "upper," and "lower" directions in a plan view refer to directions in which the electronic device 1 is vertically seen. For example, "left" may refer to a −x direction, "right" may refer to a +x direction, "upper" may refer to a +y direction, and "lower" may refer to a −y direction. Although one transmissive area TA is provided in FIG. 1, a plurality of transmissive areas TA may be provided in another embodiment.

Figure 2:
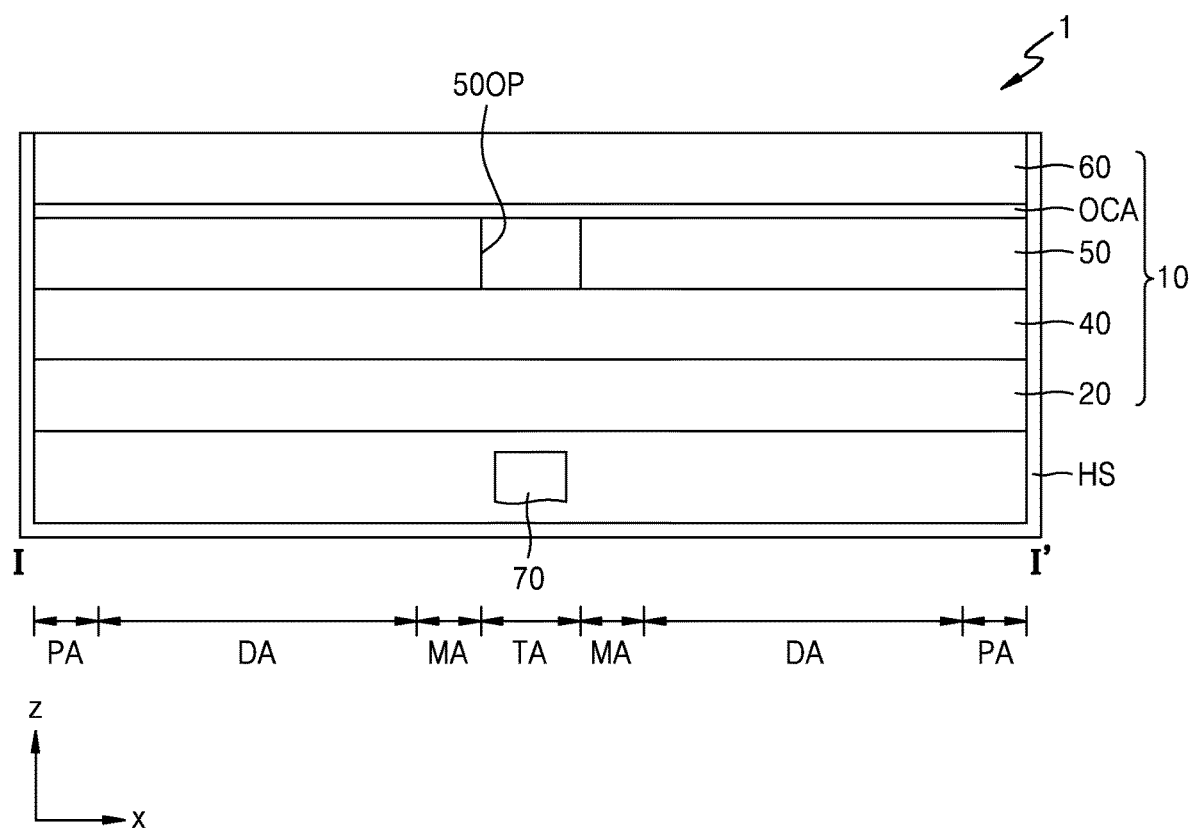
FIG. 2 is a cross-sectional view of the electronic device taken along line I-I' of FIG. 1 according to an embodiment.

FIG. 2 is a cross-sectional view of the electronic device 1 taken along line I-I' of FIG. 1 according to an embodiment.

Referring to FIG. 2, the electronic device 1 may include a display panel 10, and a component 70 located in the transmissive area TA of the electronic device 1. The display panel 10 and the component 70 may be accommodated in a housing HS.

The display panel 10 may include an image generating layer 20, an input sensing layer 40, an optical layer 50, and a cover window 60.

The image generating layer 20 may include display elements (e.g., light-emitting elements) that emit light to display an image. The display element may include a light-emitting diode, for example, an organic light-emitting diode including an organic emission layer. In another embodiment, the light-emitting diode may be an inorganic light-emitting diode including an inorganic material. The inorganic light-emitting diode may include a PN junction diode that includes an inorganic semiconductor-based material. When a voltage is applied to the PN junction diode in a forward direction, holes and electrons may be injected, and energy generated by recombination of the holes and electrons may be converted into light energy to emit light of a specific color. The inorganic light-emitting diode may have a width of several to hundreds of micrometers, or several to hundreds of nanometers. In some embodiments, the image generating layer 20 may include quantum-dots. For example, an emission layer of the image generating layer 20 may include an organic material, may include an inorganic material, may include quantum dots, may include an organic material and quantum dots, or may include an inorganic material and quantum dots.

The input sensing layer 40 may obtain coordinate information according to an external input, for example, a touch event. The input sensing layer 40 may include a sensing electrode (or a touch electrode) and trace lines electrically connected to the sensing electrode. The input sensing layer 40 may be located on the image generating layer 20. The input sensing layer 40 may detect the external input by various sensing methods, for example, a mutual capacitance sensing method and/or a self-capacitance sensing method.

The input sensing layer 40 may be formed directly on the image generating layer 20, or may be separately formed and then coupled to the image generating layer 20 through an adhesive layer (not shown) such as an optical clear adhesive. For example, the input sensing layer 40 may be continuously formed on the image generating layer 20 without the adhesive layer therebetween. Although FIG. 2 shows that the input sensing layer 40 is located between the image generating layer 20 and the optical layer 50, the input sensing layer 40 may be located over the optical layer 50 in another embodiment.

The optical layer 50 may include an anti-reflection layer. The anti-reflection layer may reduce a reflectance of light (e.g., external light) incident on the display panel 10 through the cover window 60. The anti-reflection layer may include a phase retarder and a polarizer. The phase retarder may be of a film type or a liquid crystal coating type. The polarizer may also be of a film type or a liquid crystal coating type. The polarizer of the film type may include a stretchable synthetic resin film, and the polarizer of the liquid-crystal coating type may include liquid crystals arranged with a predetermined orientation. When the optical layer 50 includes the polarizer, the optical layer 50 may include an opening 50OP to increase a transmittance of the transmissive area TA.

In another embodiment, the anti-reflection layer may include a black matrix and color filters. The color filters may be arranged according to a color of light emitted by the light-emitting diodes of the image generating layer 20. In another embodiment, the anti-reflection layer may have a destructive interference structure. The destructive interference structure may include a first reflective layer and a second reflective layer that are located in different layers. First reflected light and second reflected light respectively reflected by the first reflective layer and the second reflective layer may be destructively interfered with each other, thereby reducing a reflectance of external light.

The cover window 60 may be located on the optical layer 50. The cover window 60 may be coupled to the optical layer 50 through an adhesive layer such as an optical clear adhesive (OCA) located therebetween. The cover window 60 may include a glass material or a plastic material. The glass material may include ultra-thin glass. The plastic material may include polyethersulfone, polyacrylate, polyether imide, polyethylene naphthalate, polyethylene terephthalate, polyphenylene sulfide, polyarylate, polyimide, polycarbonate, or cellulose acetate propionate.

The transmissive area TA may correspond to a component area (e.g., a sensor area, a camera area, or a speaker area) in which the component 70 of the electronic device 1 may be located.

The component 70 may include an electronic element. For example, the component 70 may be an electronic element using light or sound. For example, the electronic element may include a sensor that uses light such as an infrared sensor, a camera that captures an image by receiving light, a sensor that measures a distance or recognizes a fingerprint by outputting and detecting light or sound, a small lamp that outputs light, or a speaker that outputs sound. The electronic element using light may use light of wavelength bands of visible light, infrared light, and/or ultraviolet light. The transmissive area TA may correspond to an area through which light and/or sound that are output from the component 70 to the outside or input from the outside to the component 70 may be transmitted.

Figure 3:
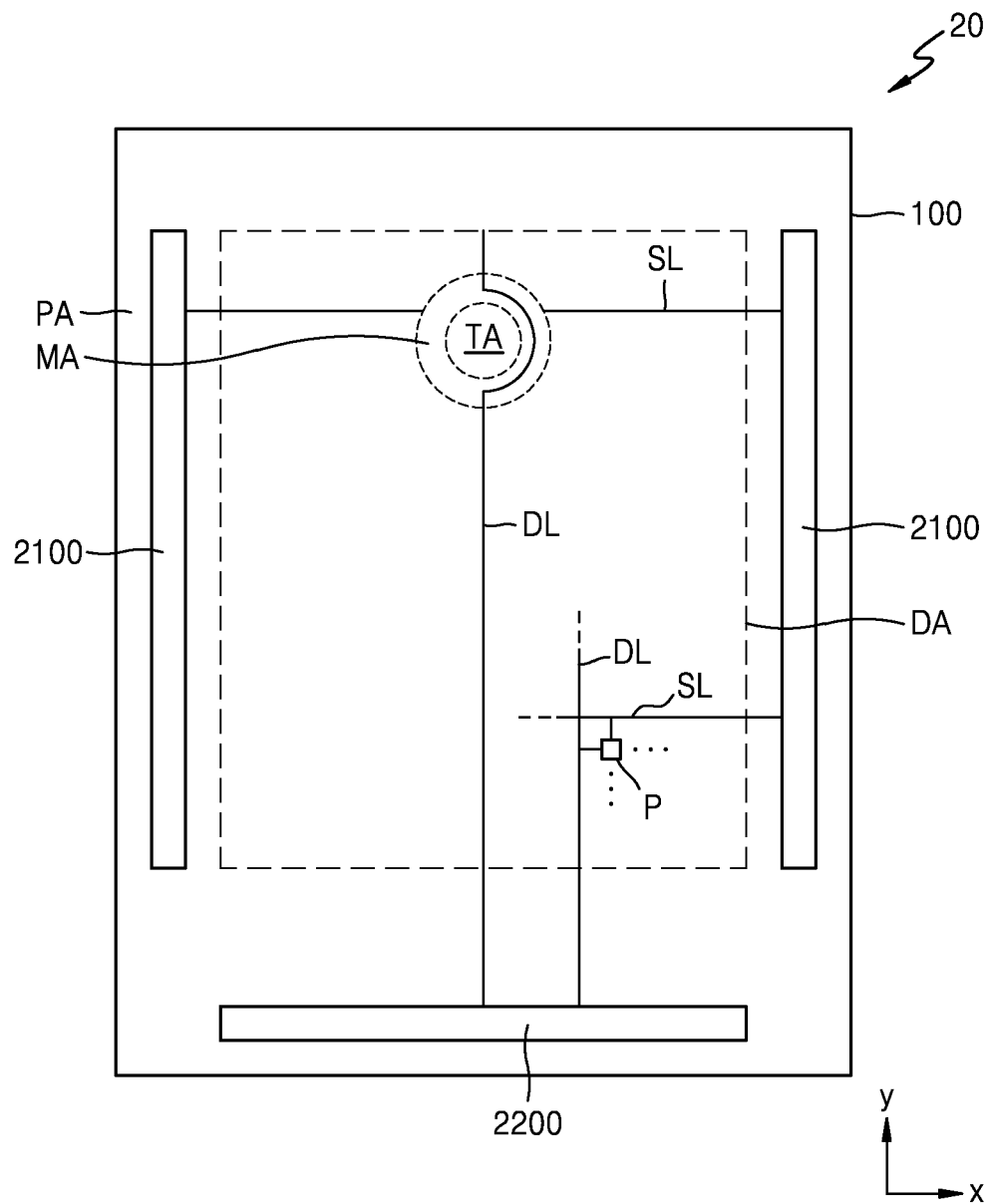
FIG. 3 is a plan view of an image generating layer according to an embodiment.
Figure 4:
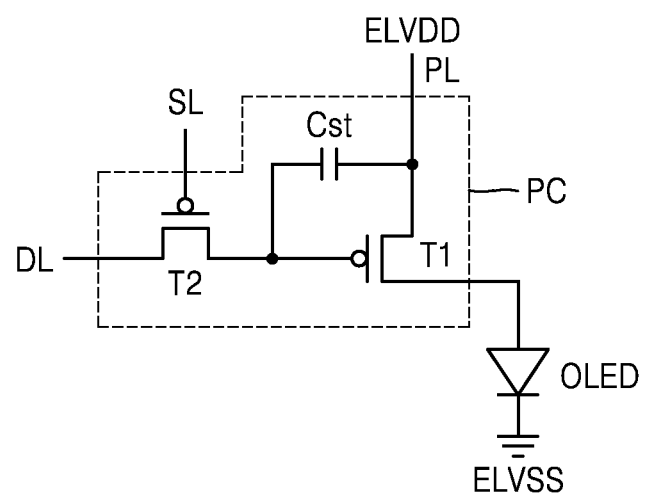
FIG. 4 is a diagram illustrating an equivalent circuit connected to a light-emitting diode of a display panel.

FIG. 3 is a plan view of the image generating layer 20 according to an embodiment. FIG. 4 is a diagram illustrating an equivalent circuit electrically connected to a light-emitting diode of the display panel 10.

Referring to FIG. 3, the display panel 10 may include the transmissive area TA, the display area DA, the intermediate area MA, and the peripheral area PA. The display panel 10 may include a plurality of sub-pixels P located in the display area DA, and may display an image by using light emitted by the sub-pixels P. Each sub-pixel P may include a light-emitting diode that may emit light of a predetermined color.

The light-emitting diode of each sub-pixel P may include an organic light-emitting diode OLED as shown in FIG. 4, and each organic light-emitting diode OLED may be electrically connected to a sub-pixel circuit PC. Although FIG. 4 shows the organic light-emitting diode OLED as a non-limiting example of the light emitting diode, the display panel 10 may include an inorganic light-emitting diode instead of the organic light-emitting diode OLED in another embodiment.

The sub-pixel circuit PC may include one or more transistors and at least one capacitor for operating the organic light-emitting diode OLED. For example, the sub-pixel circuit PC may include a first thin-film transistor T1, a second thin-film transistor T2, and a storage capacitor Cst.

The second thin-film transistor T2 also referred to as a switching thin-film transistor may be electrically connected to a scan line SL and a data line DL, and may transmit a data voltage that is input from the data line DL to the first thin-film transistor T1 according to a switching voltage that is input from the scan line SL. The storage capacitor Cst may be electrically connected to the second thin-film transistor T2 and a driving voltage line PL, and may store a voltage corresponding to a difference between a voltage received from the second thin-film transistor T2 and a first power supply voltage ELVDD that is supplied to the driving voltage line PL.

The first thin-film transistor T1 also referred to as a driving thin-film transistor may be electrically connected to the driving voltage line PL and the storage capacitor Cst, and may control driving current flowing from the driving voltage line PL to the organic light-emitting diode OLED according to an amount of the voltage stored in the storage capacitor Cst. The organic light-emitting diode OLED may emit light having a luminance corresponding to the driving current. A first electrode (e.g., an anode) of the organic light-emitting diode OLED may be electrically connected to the first thin-film transistor T1, and a second electrode (e.g., a cathode) of the organic light-emitting diode OLED may be electrically connected to a voltage line that supplies a second power supply voltage ELVSS.

Although the sub-pixel circuit PC shown in FIG. 4 shows an example that includes two thin-film transistors and one storage capacitor, the present disclosure is not limited thereto. The number of thin-film transistors and the number of storage capacitors may be changed in various ways according to a design of the sub-pixel circuit PC.

Referring back to FIG. 3, the intermediate area MA may surround the transmissive area TA. The intermediate area MA may correspond to an area where a display element such as the organic light-emitting diode OLED that emits light is not located, and signal lines for applying signals to the sub-pixels P located in or around the transmissive area TA may pass through the intermediate area MA. For example, the data lines DL and/or the scan lines SL may cross the display area DA, and some of the data lines DL and/or the scan lines SL may bypass the transmissive area TA through the intermediate area MA along an edge of the transmissive area TA. In an embodiment, in FIG. 3, the data lines DL may extend the display area DA substantially in the y direction, and some data lines DL bypass the transmissive area TA to partially surround the transmissive area TA in the intermediate area MA. The scan lines SL may extend the display area DA substantially in the x direction, and may be spaced apart from each other with the transmissive area TA therebetween.

In the peripheral area PA, one or more scan drivers 2100 for applying a scan signal to each sub-pixel P, a data driver 2200 for applying a data signal to each sub-pixel P, and a first power supply wiring (not shown) and a second power supply wiring (not shown) for respectively supplying the first power supply voltage ELVDD (see FIG. 4) and the second power supply voltage ELVSS (see FIG. 4) may be located. The scan drivers 2100 may be located on opposite sides of the display area DA with the display area DA therebetween. In this case, the sub-pixel P located on the left side of the transmissive area TA may be electrically connected to the scan driver 2100 located on the left side, and the sub-pixel P located on the right side of the transmissive area TA may be electrically connected to the scan driver 2100 located on the right side.

Although FIG. 3 shows that the data driver 2200 is located adjacent to a side of a substrate 100 of the image generating layer 20, in another embodiment, the data driver 2200 may be located on a circuit board (e.g., a printed circuit board) that is electrically connected to a pad located on a side of the display panel 10. The circuit board may be flexible, and a part of the circuit board may be bent to be located under a rear surface of the substrate 100.

Figure 5:
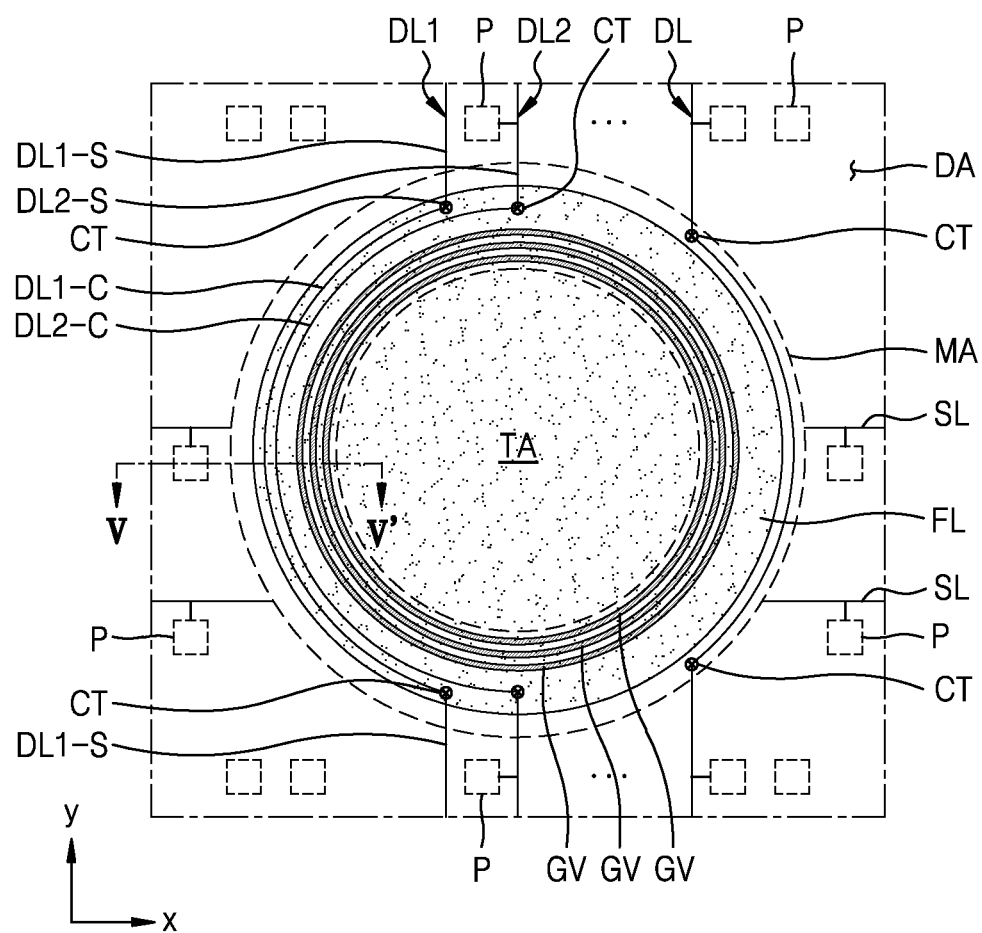
FIG. 5 is a plan view illustrating a part of a display panel according to an embodiment.

FIG. 5 is a plan view illustrating a part of a display panel according to an embodiment.

The sub-pixels P may be located in the display area DA, and the intermediate area MA may be located between the transmissive area TA and the display area DA. Some of the sub-pixels P adjacent to the transmissive area TA may be spaced apart from each other with the transmissive area TA therebetween in a plan view. As shown in FIG. 5, the sub-pixels P may be vertically spaced apart from each other with the transmissive area TA therebetween, or may be horizontally spaced apart from each other with the transmissive area TA therebetween. As described with reference to FIGS. 3 and 4, because each sub-pixel P emits red, green, or blue light using a light-emitting diode, locations of the sub-pixels P correspond to locations of their light-emitting diodes. Accordingly, when the sub-pixels P are spaced apart from each other with the transmissive area TA therebetween, it may be perceived to a user that light-emitting diodes are spaced apart from each other with the transmissive area TA therebetween. For example, in a plan view, the light-emitting diodes of the sub-pixels P may be vertically spaced apart from each other with the transmissive area TA therebetween, or may be horizontally spaced apart from each other with the transmissive area TA therebetween.

Signal lines adjacent to the transmissive area TA among signal lines that apply various signals to the sub-pixel circuit PC electrically connected to a light-emitting diode of each sub-pixel P may bypass the transmissive area TA. Some data lines among the data lines DL passing through the display area DA may extend in the y direction to apply data signals to the sub-pixels P respectively, and may bypass the transmissive area TA through the intermediate area MA along an edge of the transmissive area TA. For example, a first data line DL1 and a second data line DL2 among the data lines DL respectively include extending portions DL1-S and DL2-S in the y direction. The upper and lower extending portions DL1-S of the first data line DL1 may be spaced apart from each other with the transmissive area TA therebetween, and may be electrically connected to each other by a bypass portion DL1-C that bypasses the transmissive area TA through the intermediate area MA. In one embodiment, the bypass portion DL1-C may be electrically connected to the upper and lower extending portions DL1-S through a respective contact hole CT that passes through an insulating layer located between the extending portions DL1-S and the bypass portion DL1-C. Likewise, the upper and lower extending portions DL2-S of the second data line DL2 may be spaced apart from each other with the transmissive area TA therebetween, and may be electrically connected to each other by a bypass portion DL2-C that bypasses the transmissive area TA through the intermediate area MA. The bypass portion DL2-C may be electrically connected to the upper and lower extending portions DL2-S through a respective contact hole CT that passes through an insulating layer located between the extending portions DL2-S and the bypass portion DL2-C.

The scan lines SL may be separated or disconnected from each other with the transmissive area TA therebetween. For example, the scan line SL located on the left side of the transmissive area TA may receive a signal from the scan driver 2100 located on the left side of the display area DA, and the scan line SL located on the right side of the transmissive area TA may receive a signal from the scan driver 2100 located on the right side of the display area DA as described with reference to FIG. 3.

A filling layer FL may be located in the transmissive area TA. The filling layer FL may include a transparent material such as a silicon-based material. The filling layer FL may be formed to entirely cover the transmissive area TA. In an embodiment, in a case where the transmissive area TA has a round shape (e.g., a circular shape or an elliptical shape), the filling layer FL may also have a round shape corresponding to the round shape of the transmissive area TA. In a plan view, the filling layer FL may have a size greater than that of the transmissive area TA, and an outer portion of the filling layer FL may be extended to the intermediate area MA. The filling layer FL has an isolated shape and may not extend to the display area DA. An edge of the filling layer FL may be more adjacent to the transmissive area TA than an edge of the intermediate area MA.

The filling layer FL may be formed by applying the silicon-based material and performing thermal curing. During a coating process of the filling layer FL, a material for forming the filling layer FL may have some fluidity, and a groove GV may be formed in the intermediate area MA to control the flow of the material. FIG. 5 illustrates a plurality of grooves GV, and each groove GV may have a closed loop shape surrounding the transmissive area TA in a plan view. The grooves GV may be spaced apart from one another, and the groove GV close to the transmissive area TA may have a diameter smaller than that of the groove GV farther from the transmissive area TA.

Figure 6:
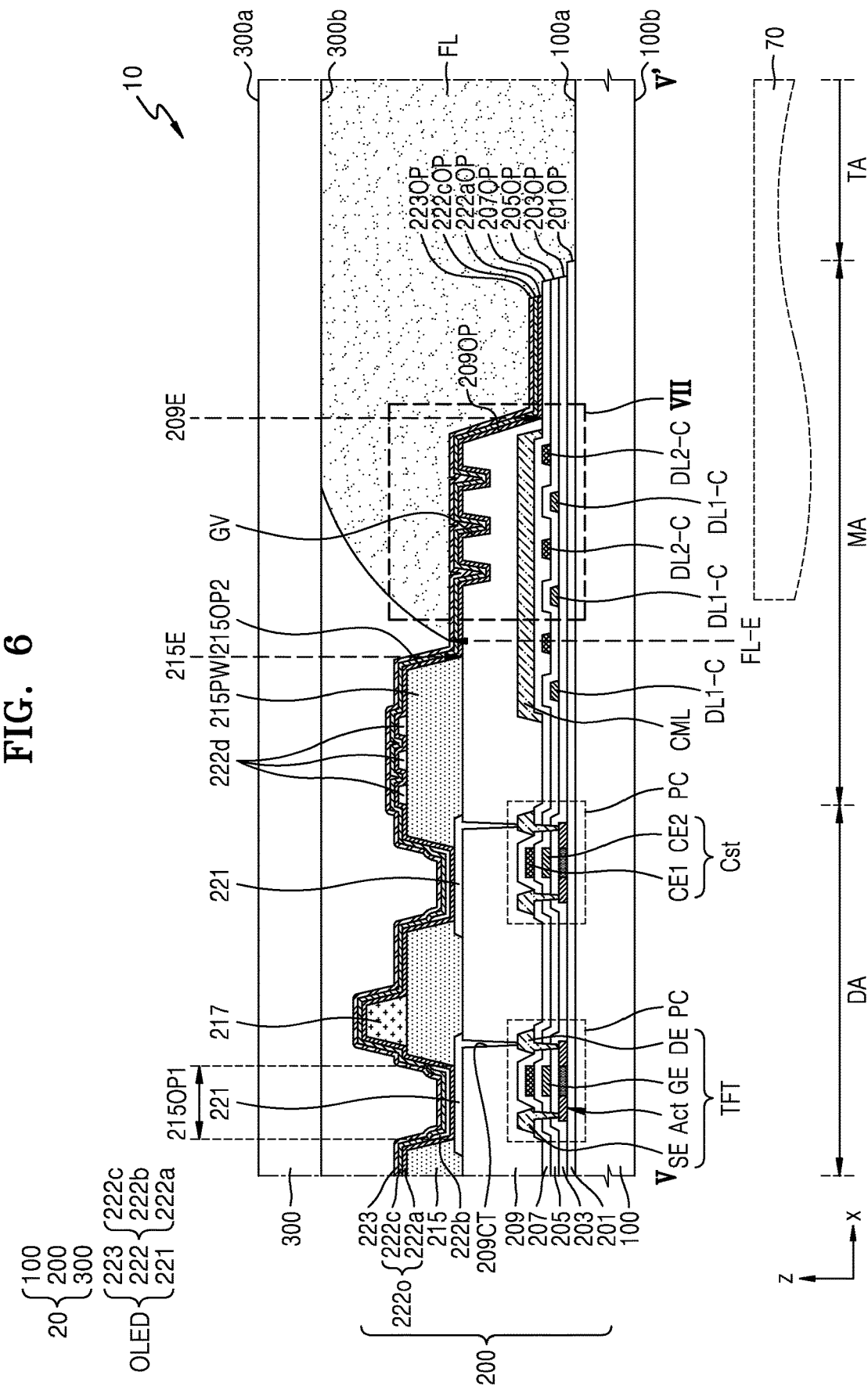
FIG. 6 is a cross-sectional view of a display panel according to an embodiment.

FIG. 6 is a cross-sectional view of the display panel 10 according to an embodiment, taken along line V-V of FIG. 5. FIG. 6 illustrates the image generating layer 20 for convenience of description, and the input sensing layer 40, the optical layer 50, and the cover window 60 of the display panel 10 are not shown. The image generating layer 20 includes light-emitting diodes located on the substrate 100 to correspond to the display area DA, and FIG. 6 illustrates each light-emitting diode includes as an organic light-emitting diode OLED as a non-limiting example.

The image generating layer 20 may include the substrate 100 and an encapsulation substrate 300, and a circuit-display element layer 200 between the substrate 100 and the encapsulation substrate 300. The circuit-display element layer 200 may include the groove GV, the organic light-emitting diode OLED, and the sub-pixel circuits PC.

Referring to the display area DA of FIG. 6, the sub-pixel circuit PC may be located on the substrate 100, and the organic light-emitting diode OLED may be located on the sub-pixel circuit PC.

The substrate 100 may include a glass material or a polymer resin. Examples of the polymer resin may include, but are not limited to, polyethersulfone, polyacrylate, polyetherimide, polyethylene naphthalate, polyethylene terephthalate, polyphenylene sulfide, polyarylate, polyimide, polycarbonate, and cellulose acetate propionate.

A buffer layer 201 may be located on an upper surface of the substrate 100. The buffer layer 201 may prevent impurities from penetrating into a semiconductor layer Act of a thin-film transistor TFT (e.g., the first thin-film transistor T1 and the second thin-film transistor T2 of FIG. 4). The buffer layer 201 may include an inorganic insulating material such as silicon nitride, silicon oxynitride, or silicon oxide, and may have a single or multi-layer structure including the inorganic insulating material.

The sub-pixel circuit PC may be located on the buffer layer 201. The sub-pixel circuit PC includes the thin-film transistor TFT and the storage capacitor Cst. The thin-film transistor TFT may include the semiconductor layer Act, a gate electrode GE, a source electrode SE, and a drain electrode DE. Although FIG. 6 illustrates the thin-film transistor TFT as a top gate-type transistor in which the gate electrode GE is located on the semiconductor layer Act with a first insulating layer 203 interposed therebetween, the thin-film transistor TFT may be a bottom gate-type transistor in another embodiment.

The semiconductor layer Act may include polysilicon or amorphous silicon, an oxide semiconductor, or an organic semiconductor. The gate electrode GE may include a low-resistance metal material. The gate electrode GE may include a conductive material including molybdenum (Mo), aluminum (Al), copper (Cu), or titanium (Ti), and may have a single or multi-layer structure including the conductive material.

The first insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or hafnium oxide. The first insulating layer 203 may have a single or multi-layer structure including the inorganic material.

The source electrode SE and the drain electrode DE may be located on a third insulating layer 207, and may be respectively electrically connected to a source region and a drain region of the semiconductor layer Act. Each of the source electrode SE and the drain electrode DE may include a material having high conductivity. Each of the source electrode SE and the drain electrode DE may include a conductive material including molybdenum (Mo), aluminum (Al), copper (Cu), or titanium (Ti), and may have a single or multi-layer structure including the conductive material. In an embodiment, each of the source electrode SE and the drain electrode DE may have a multi-layer structure including a titanium layer, an aluminum layer, and another titanium layer (Ti/Al/Ti).

The storage capacitor Cst may include an upper electrode CE1 and a lower electrode CE2 overlapping each other with a second insulating layer 205 therebetween. In one embodiment, the storage capacitor Cst may overlap the thin-film transistor TFT. In this case, the gate electrode GE of the thin-film transistor TFT may correspond to or may be electrically connected to a portion of the lower electrode CE2 of the storage capacitor Cst. In another embodiment, the storage capacitor Cst may not overlap the thin-film transistor TFT, and the gate electrode GE of the thin-film transistor TFT and the lower electrode CE2 of the storage capacitor Cst may be separately formed. The storage capacitor Cst may be covered by the third insulating layer 207.

The lower electrode CE2 and/or the upper electrode CE1 of the storage capacitor Cst may include a conductive material including molybdenum (Mo), aluminum (Al), copper (Cu), or titanium (Ti), and may have a single or multi-layer structure including the conductive material.

Each of the second insulating layer 205 and the third insulating layer 207 may include an inorganic insulating material such as silicon oxide, silicon nitride, silicon oxynitride, aluminum oxide, titanium oxide, tantalum oxide, or hafnium oxide. Each of the second insulating layer 205 and the third insulating layer 207 may have a single or multi-layer structure including the inorganic insulating material. In one embodiment, each of the second insulating layer 205 and the third insulating layer 207 may include an organic insulating material such as polyimide.

The sub-pixel circuit PC including the thin-film transistor TFT and the storage capacitor Cst may be covered by a fourth insulating layer 209 between the sub-pixel circuit PC and a first electrode 221 of the organic light-emitting diode OLED. The fourth insulating layer 209 may have a substantially flat top surface. The fourth insulating layer 209 may include an organic insulating material. The organic insulating material may include a polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any blend thereof.

The first electrode 221 of the organic light-emitting diode OLED may be located on the fourth insulating layer 209 overlapping the sub-pixel circuit PC in a plan view. The first electrode 221 may have an isolated shape for each sub-pixel P, and may be electrically connected to the sub-pixel circuit PC through a contact hole 209CT that passes through the fourth insulating layer 209.

The first electrode 221 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). In another embodiment, the first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another embodiment, the first electrode 221 may further include a film formed of ITO, IZO, ZnO, or In$_2$O$_3$ over/under the reflective film. In an embodiment, the first electrode 221 may have a three-layer structure including ITO/Ag/ITO.

An upper insulating layer 215 may be formed on the first electrode 221. The upper insulating layer 215 may include a first opening 215OP1 overlapping the first electrode 221, and may cover an edge of the first electrode 221. The upper insulating layer 215 may define a light-emitting area of a sub-pixel P through the first opening 215OP1. A size of the first opening 215OP1 may correspond to a size of the light-emitting area and/or a size of the sub-pixel P. For example, a width of the first opening 215OP1 through which a top surface of the first electrode 221 is exposed may correspond to a width of the light-emitting or a width of the sub-pixel P.

The upper insulating layer 215 may include an organic insulating material. For example, the upper insulating layer 215 may include an organic insulating material such as a polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any blend thereof.

A spacer 217 may be formed on the upper insulating layer 215. The spacer 217 may include an organic insulating material. In one embodiment, the spacer 217 may include the same material as that of the upper insulating layer 215, and may be formed together with the upper insulating layer 215 using the same mask.

An intermediate layer 222 includes an emission layer 222b. The emission layer 222b may include a high molecular weight organic material or a low molecular weight organic material emitting light of a specific color. The intermediate layer 222 may include one or more functional layers. For example, the intermediate layer 222 may include a first functional layer 222a located under the emission layer 222b and/or a second functional layer 222c located over the emission layer 222b.

The first functional layer 222a may have a single or multi-layer structure. For example, the first functional layer 222a may include a hole injection layer (HIL) and/or a hole transport layer (HTL).

The second functional layer 222c may have a single or multi-layer structure. For example, the second functional layer 222c may include an electron transport layer (ETL) and/or an electron injection layer (EIL).

At least one organic material layer 222o included in the intermediate layer 222, for example, the first functional layer 222a and/or the second functional layer 222c, may be formed to entirely cover the display area DA. While the emission layers 222b of different colors may be spaced apart from one another according to colors of sub-pixels P in the display area DA, the first functional layer 222a and/or the second functional layer 222c may be formed to entirely cover a plurality of sub-pixels P in the display area DA. Each of the first functional layer 222a and the second functional layer 222c may be shared by the plurality of sub-pixels P located in the display area DA.

A second electrode 223 may be formed of a conductive material having a low work function. For example, the second electrode 223 may include a transparent layer or a semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. The second electrode 223 may further include a layer formed of ITO, IZO, ZnO, or In$_2$O$_3$ formed on the semi-transparent layer including at least one of the above-listed materials. In an embodiment, the second electrode 223 may include silver (Ag) and magnesium (Mg). The second electrode 223 may be formed to entirely cover the display area DA. For example, the second electrode 223 may be integrally formed to entirely cover a plurality of first electrodes 221 in the display area DA.

The organic light-emitting diode OLED including the first electrode 221, the intermediate layer 222, and the second electrode 223 may be covered by the encapsulation substrate 300. The encapsulation substrate 300 may include a glass material or a polymer resin.

Referring to the transmissive area TA of FIG. 6, the filling layer FL may be located between the substrate 100 and the encapsulation substrate 300 in a z direction (or a thickness direction of the display panel 10 perpendicular to the top surface of the substrate 100).

Insulating layers on the substrate 100, for example, the buffer layer 201, and the first through fourth insulating layers 203, 205, 207, and 209, may respectively include openings 201OP, 203OP, 205OP, 207OP, and 209OP in the transmissive area TA, and the filling layer FL may directly contact the substrate 100 and the encapsulation substrate 300. The openings 201OP, 203OP, 205OP, 207OP, and 209OP of the buffer layer 201 and the first through fourth insulating layers 203, 205, 207, and 209 may have different sizes. In the embodiment shown in FIG. 6, the openings 203OP, 205OP, and 207OP of the first through third insulating layers 203, 205, and 207 are larger than the opening 201OP of the buffer layer 201 and smaller than the opening 209OP of the fourth insulating layer 209.

The transmissive area TA may be defined by at least one insulating layer selected from the buffer layer 201 and the first through four insulating layers 203, 205, 207, and 209. In an embodiment, a size of the transmissive area TA may be defined as a size of a small opening among the openings 201OP, 203OP, 205OP, 207OP, and 209OP. For example, FIG. 6 illustrates that the size of the transmissive area TA is defined as a size of the opening 201OP of the buffer layer 201. However, the present disclosure is not limited thereto. A size of the transmissive area TA may be defined by size of any one opening of other insulating layers.

A top surface 100a of the substrate 100 and a bottom surface 300b of the encapsulation substrate 300 face each other, and the filling layer FL may directly contact the top surface 100a of the substrate 100 and the bottom surface 300b of the encapsulation substrate 300. The filling layer FL may include a transparent material, for example, a silicon-based adhesive.

The transparent material of the filling layer FL may have a refractive index that is different from a refractive index of the substrate 100 and/or the encapsulation substrate 300, and a refractive index difference between the filling layer FL and the substrate 100 and/or the encapsulation substrate 300 may be about 0.4 or less. In some embodiments, the refractive index difference between the filling layer FL and the substrate 100 and/or the encapsulation substrate 300 may be about 0.3 or less (or about 0.2 or less). For example, the refractive index of the substrate 100 and/or the encapsulation substrate 300 may be about 1.5, and the refractive index of the filling layer FL may be about 1.4.

In cases where the refractive index of the filling layer FL satisfies the above condition, light incident on or emitted from the component 70 located below a bottom surface 100b of the substrate 100 may be prevented from being distorted due to the refractive index difference between the substrate 100 and the filling layer FL and/or the refractive index difference between the encapsulation substrate 300 and the filling layer FL. For example, the component 70 includes a camera, and external light having external object information whose image is captured by the camera passes through the transmissive area TA. External light travels from a top surface 300a of the encapsulation substrate 300 toward the bottom surface 100b of the substrate 100. In a case where the filling layer FL is not provided, for example, air fills a gap between the substrate 100 and the encapsulation substrate 300, the external light is refracted due to a refractive index difference between the substrate 100 and the air and/or a refractive index difference between the encapsulation substrate 300 and the air, and light reaching the camera may have distorted object information. The filling layer FL may prevent the issue of object information distortion due to the refractive index difference.

The filling layer FL may be formed by applying a material (e.g., a silicon-based material) and performing thermal curing the material. The material may have some fluidity prior to thermal curing. The groove GV located in the intermediate area MA may prevent the material from flowing to the display area DA.

The groove GV may be formed in the fourth insulating layer 209. A portion of the fourth insulating layer 209 located between the sub-pixel circuit PC and the first electrode 221 of the organic light-emitting diode OLED may extend to the transmissive area TA, and a portion of the fourth insulating layer 209 located in the intermediate area MA may include the groove GV. The groove GV may be formed when the contact hole 209CT is formed. In an embodiment, after a material for forming the fourth insulating layer 209 is entirely formed on the substrate 100, the contact hole 209CT and the groove GV may be formed by performing exposure using a mask and development. In this case, the mask may include a halftone area, a full tone area, and/or an opening area.

The contact hole 209CT of the fourth insulating layer 209 may be exposed through the opening area of the mask, and may be formed to penetrating through the fourth insulating layer 209 in the thickness direction of the display panel 10 (z direction). In contrast, the groove GV of the fourth insulating layer 209 may be exposed through the halftone area of the mask, and may be formed by removing a part of the fourth insulating layer 209 in the thickness direction (z direction) without penetrating through the insulating layer 209. A depth of the groove GV may be less than a thickness of the fourth insulating layer 209.

The groove GV may not be covered by the upper insulating layer 215. For example, the upper insulating layer 215 may include a second opening 215OP2 that overlaps at least a portion of the intermediate area MA and the transmissive area TA. The second opening 215OP2 of the upper insulating layer 215 may be larger than the opening 209OP of the fourth insulating layer 209. Accordingly, the groove GV may be located between an edge 215E of the upper insulating layer 215 that defines the second opening 215OP2 of the upper insulating layer 215 and an edge 209E of the fourth insulating layer 209 that defines the opening 209OP of the fourth insulating layer 209. In other words, the edge 215E of the upper insulating layer 215 defining the second opening 215OP2 may be located closer to the display area DA than the grooves GV and the edge 209E of the fourth insulating layer 209, and the edge 209E of the fourth insulating layer 209 may be located closer to the transmissive area TA than the grooves GV and the edge 215E of the upper insulating layer 215.

When the material for forming the filling layer FL is applied, the material may be prevented from flowing to the display area DA due to an uneven structure of the grooves GV, and a flow of the filling layer FL may be controlled during a process of manufacturing the display panel 10. The filling layer FL may overlap the grooves. In the embodiment shown in FIG. 6, the filling layer FL may overlap all of the grooves GV.

A part 215PW of the upper insulating layer 215 that is located between the first opening 215OP1 that is closest to the transmissive area TA and the intermediate area MA among the first openings 215OP1 and the second opening 215OP2 of the upper insulating layer 215 may control a flow of the material for forming the filling layer FL over the grooves GV. The part 215PW of the upper insulating layer 215 may have a shape entirely surrounding the transmissive area TA in a plan view, and may correspond to a partition wall that prevents the material for forming the filling layer FL that is slowed down by the grooves GV from flowing to the display area DA. In this regard, in FIG. 6, an edge FL-E of the filling layer FL may be located closer to the transmissive area TA than the part 215PW of the upper insulating layer 215. For example, the edge FL-E of the filling layer FL may be located between the edge 215E of the upper insulating layer 215 and the outmost groove GV among the grooves GV. In some embodiments, one or more dummy emission layers 222d may be located on the part 215PW of the upper insulating layer 215.

To impart transmissive characteristic to the transmissive area TA, the first function layer 222a, the second functional layer 222c, and the second electrode 223 of the organic light-emitting diode OLED may respectively include openings 222aOP, 222cOP, and 223OP overlapping the transmissive area TA. In an embodiment, sizes of the openings 222aOP, 222cOP, and 223OP may be less than the size of the opening 209OP of the fourth insulating layer 209. In the embodiment shown in FIG. 6, edges of the first functional layer 222a, the second functional layer 222c, and the second electrode 223 that respectively defines the openings 222aOP, 222cOP, and 223OP may be located on the third insulating layer 207, and the first functional layer 222a, the second functional layer 222c, and the second electrode 223 may respectively overlap the grooves GV.

Wirings that bypass a periphery of the transmissive area TA may be located under the grooves GV in the intermediate area MA. For example, as shown in FIG. 6, the bypass portion DL1-C of the first data line DL1 and the bypass portion DL2-C of the second data line DL2 may be located in the intermediate area MA under the grooves GV. A conductive layer CML may be located between the grooves GV and the bypass portions DL1-C and DL2-C.

Figure 7:
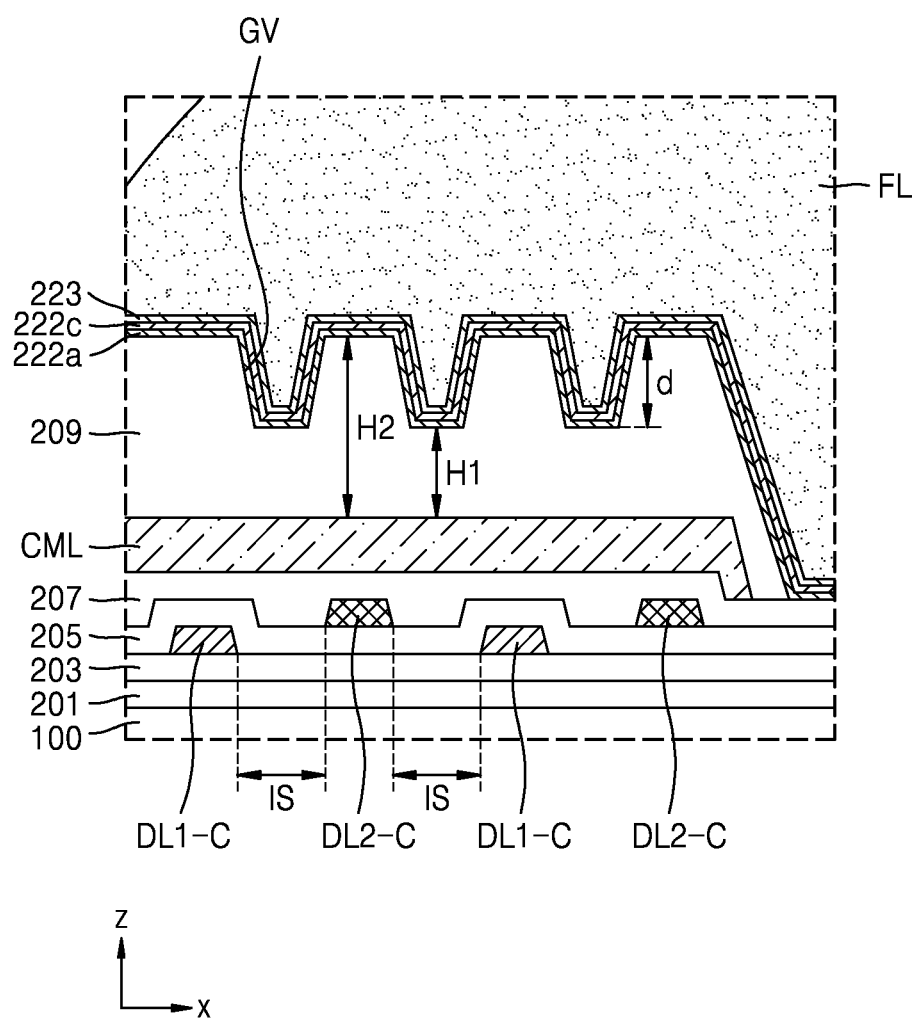
FIG. 7 is an enlarged cross-sectional view illustrating a portion of an intermediate area of FIG. 6.

FIG. 7 is an enlarged cross-sectional view illustrating a portion VII of FIG. 6.

The bypass portion DL1-C of the first data line DL1 and the bypass portion DL2-C of the second data line DL2 that are adjacent to each other may be located on different layers. In one embodiment, the bypass portion DL1-C of the first data line DL1 may be located on the first insulating layer 203, and the bypass portion DL2-C of the second data line DL2 may be located on the second insulating layer 205. The bypass portion DL1-C of the first data line DL1 may include the same material as that of the gate electrode GE and/or the lower electrode CE2 that is described with reference to FIG. 6, and the bypass portion DL2-C of the second data line DL2 may include the same material as that of the upper electrode CE1 that is described with reference to FIG. 6. When the bypass portion DL1-C of the first data line DL1 and the bypass portion DL2-C of the second data line DL2 are alternately located on different layers, an interval IS between the bypass portion DL1-C and the bypass portion DL2-C that is measured in the x direction may be reduced.

Because the bypass portions DL1-C and DL2-C are portions of the first and second data lines DL1 and DL2 that transmit different data signals, a small interval between the bypass portions DL1-C and DL2-C may form a parasitic capacitance between the adjacent ones of the bypass portions DL1-C and DL2-C. However, the conductive layer CML that is located on the bypass portions DL1-C and DL2-C may prevent or reduce the parasitic capacitance therebetween.

The conductive layer CML may be located on the third insulating layer 207 and may overlap the bypass portions DL1-C and DL2-C. For example, the conductive layer CML may cover the bypass portions DL1-C and DL2-C. The conductive layer CML may include the same material as that of the source electrode SE or the drain electrode DE that is described with reference to FIG. 6. The conductive layer CML may have a width that is wide enough to cover the plurality of bypass portions DL1-C and DL2-C in the x direction. The conductive layer CML may have a constant voltage level. For example, the conductive layer CML may have the same voltage level (e.g., ELVDD) as that of the driving voltage line PL that is described with reference to FIG. 4.

The grooves GV may be formed in the fourth insulating layer 209 on the conductive layer CML. The grooves GV may overlap the conductive layer CML. A bottom surface of the groove GV may be spaced apart from a top surface of the conductive layer CML in the z direction. For example, the bottom surface of the groove GV may be spaced apart by a first height H1 from the top surface of the conductive layer CML, and the first height H1 is less than a second height H2 between the top surface of the conductive layer CML and a top surface of the fourth insulating layer 209. Because the groove GV has a blind-hole shape that does not pass through the fourth insulating layer 209, a depth d of the groove G may be less than the second height H2.

The grooves GV may be spaced apart from one another in the x direction, and one groove GV may be located between two adjacent bypass portions DL1-C and DL2-C in the cross-sectional view.

In some embodiments, the first functional layer 222a, the second functional layer 222c, and the second electrode 223 may be located between the grooves GV and the filling layer FL. The first functional layer 222a, the second functional layer 222c, and the second electrode 223 may respectively cover the grooves GV. In one embodiment, each groove GV may have the depth d that is greater than a sum of thicknesses of the first functional layer 222a, the second functional layer 222c, and the second electrode 223, and the filling layer FL may fill at least a part of the groove GV. In another embodiment, the first functional layer 222a, the second functional layer 222c, and the second electrode 223 may not be located between the grooves GV and the filling layer FL. In this case, the filling layer FL may directly contact an inner surface of the groove GV.

Figure 8:
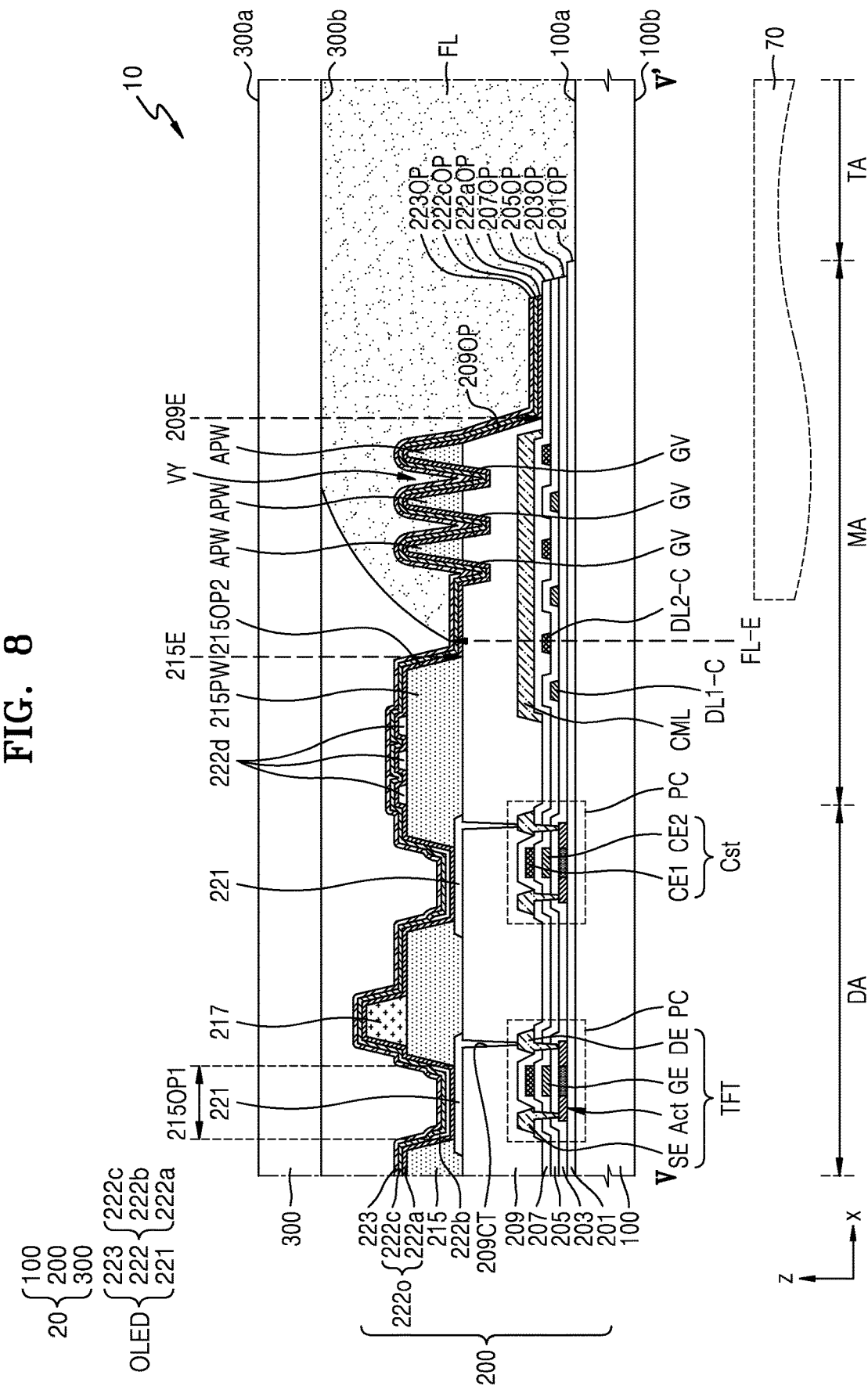
FIG. 8 is a cross-sectional view of a display panel according to another embodiment.
Figure 9:
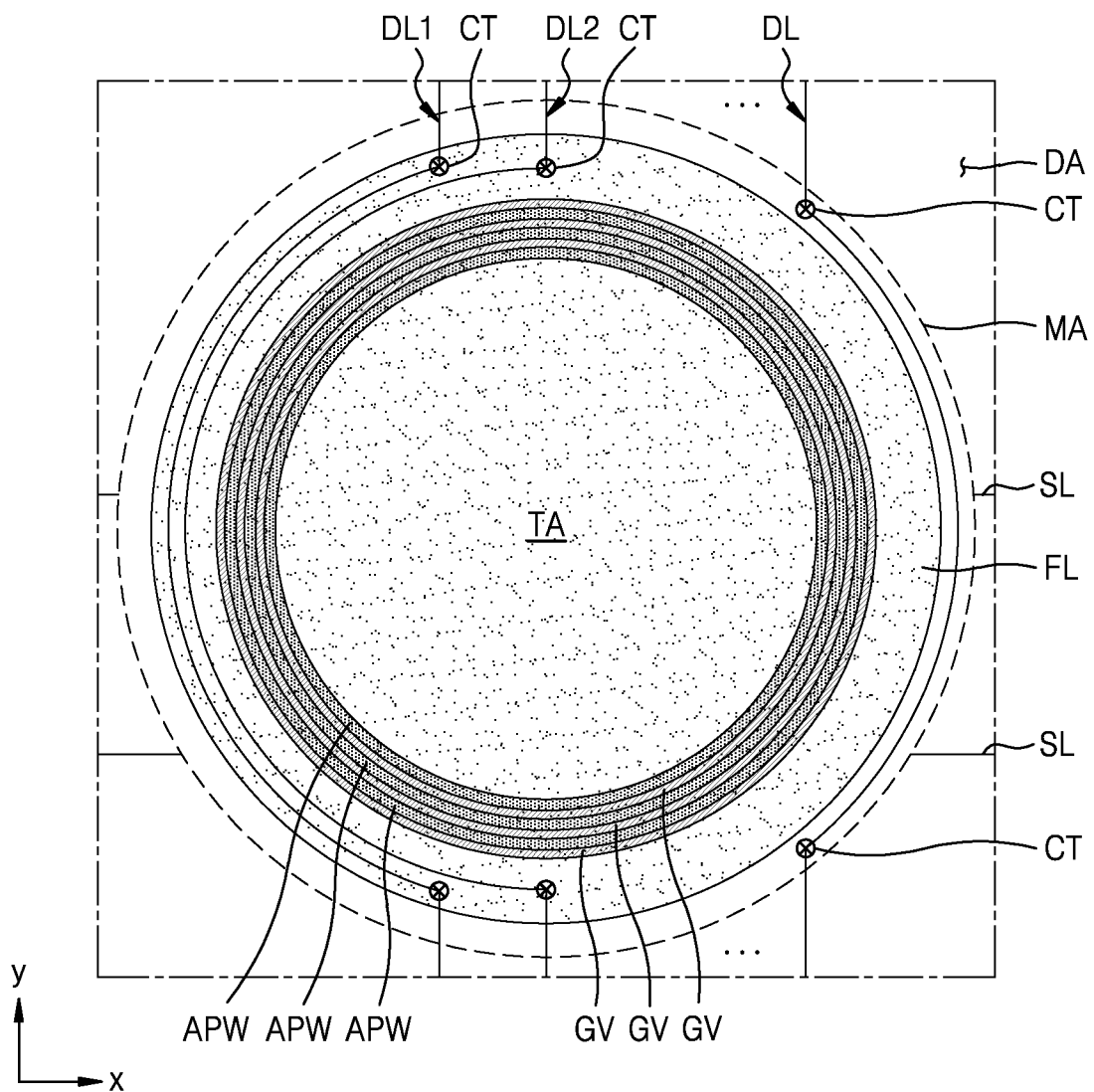
FIG. 9 is a plan view illustrating a filling layer, a groove, and an auxiliary partition wall of FIG. 8.

FIG. 8 is a cross-sectional view of a display panel according to another embodiment, taken along line V-V' of FIG. 5. FIG. 9 is a plan view illustrating a filling layer, a groove, and an auxiliary partition wall of FIG. 8. Similar to FIG. 6, FIG. 8 illustrates the image generating layer 20 of the display panel 10 for convenience of description. The image generating layer 20 includes the substrate 100, the circuit-display element layer 200, and the encapsulation substrate 300. The groove GV may have a depth that is less than a thickness of the fourth insulating layer 209 as shown in FIGS. 6 and 7, partition wall (hereinafter referred to as an auxiliary partition wall APW) is located between adjacent grooves GV among the grooves GV. A detailed structure of the circuit-display element layer 200 is substantially the same as the structure described with reference to FIG. 6, and thus the following will focus on a difference therebetween.

Referring to FIG. 8, the auxiliary partition wall APW may be located on a top surface of the fourth insulating layer 209. The auxiliary partition wall APW may include the same material as that of the upper insulating layer 215. The auxiliary partition walls APW may be formed together when the upper insulating layer 215 and the spacer 217 are formed. The spacer 217 and the upper insulating layer 215 may be formed by using a mask including a full tone area, an opening area, and a halftone area. The auxiliary partition wall APW may correspond to the halftone area of the mask. A thickness (or a height) of the auxiliary partition wall APW may be substantially the same as the thickness (or the height) of the upper insulating layer 215.

The auxiliary partition walls APW may be located between the edge 215E of the upper insulating layer 215 and the edge 209E of the fourth insulating layer 209. Referring to FIG. 9, similar to the groove GV, the auxiliary partition walls APW may have a closed loop shape surrounding the transmissive area TA in a plan view.

The groove GV may be located between adjacent auxiliary partition walls APW, and/or the auxiliary partition wall APW may be located between adjacent grooves GV. In other words, the auxiliary partition walls APW may be located on both sides of at least one groove GV, and/or the grooves GV may be located on a side of at least one auxiliary partition wall APW.

The auxiliary partition walls APW may be spaced apart from one another, and the groove GV of the fourth insulating layer 209 may be located between adjacent auxiliary partition walls APW. A valley VY that is formed between adjacent auxiliary partition walls APW may be deeper than a depth of the groove GV in a case where a space between adjacent auxiliary partition walls APW overlaps the groove GV of the fourth insulating layer 209. The valley VY may also be a groove that has a depth greater than the depth of the groove GV of the fourth insulating layer 209. For example, a depth of the valley VY may correspond to a sum of a depth of the groove GV of the fourth insulating layer 209 and a height of the auxiliary partition wall APW. The flow of the material for forming the filling layer FL may be controlled by the valley VY, and a portion of the filling layer FL may be located in the valley VY. For example, a portion of the filling layer FL may be located in a space between adjacent auxiliary partition walls APW and/or the groove GV of the fourth insulating layer 209.

The part 215PW of the upper insulating layer 215 may be located outside of the auxiliary partition walls APW in the intermediate area MA toward the display area DA to prevent the material for forming the filling layer FL that is slowed down by the valley VY from flowing to the display area DA. The part 215PW of the upper insulating layer 215 may also be a partition wall. The part 215PW of the upper insulating layer 215 may entirely surround the transmissive area TA in a plan view, as shown in FIG. 8.

It should be understood that embodiments described herein should be considered in a descriptive sense and not for purposes of limiting the present disclosure. Descriptions of features or aspects in each embodiment should typically be considered as available for other similar features or aspects in other embodiments. While one or more embodiments of the present disclosure have been described with reference to the figures, it will be understood by one of ordinary skill in the art that various changes in form and details may be made therein without departing from the spirit and scope of the present disclosure including the following claims.

What is claimed is:

1. A display panel comprising:
   a substrate;
   a plurality of pixels arranged on the substrate in a display area that surrounds a transmissive area;
   a first insulating layer arranged on the substrate and comprising an opening that overlaps the transmissive area;
   a second insulating layer arranged on the first insulating layer and comprising a groove;
   an encapsulation substrate covering the plurality of pixels; and
   a filling layer arranged between the substrate and the encapsulation substrate in the transmissive area and overlapping the groove.

2. The display panel of claim 1, wherein a depth of the groove is less than a thickness of the second insulating layer.

3. The display panel of claim 1, further comprising a plurality of data lines electrically connected to the plurality of pixels,
   wherein at least one of the plurality of data lines comprises a bypass portion that bypasses a periphery of the transmissive area, and
   wherein the bypass portion is located under the groove.

4. The display panel of claim 3, further comprising a conductive layer that overlaps the bypass portion, wherein the groove overlaps the conductive layer.

5. The display panel of claim 1, wherein a refractive index difference between the filling layer and at least one selected from the substrate and the encapsulation substrate is 0.4 or less.

6. The display panel of claim 1, wherein the filling layer comprises a silicon-based adhesive material.

7. The display panel of claim 1, wherein each of the plurality of pixels includes a light emitting diode, and
   wherein the light-emitting diode comprises:
      a first electrode;
      an intermediate layer arranged on the first electrode; and
      a second electrode, wherein at least a part of the second electrode covers the plurality of pixels.

8. The display panel of claim 7, further comprising an upper insulating layer that covers an edge of the first electrode of the light-emitting diode,
   wherein the upper insulating layer comprises a first opening that overlaps the first electrode and a second opening that overlaps the transmissive area, and
   wherein an edge of the upper insulating layer defining the second opening is closer to the light-emitting diode than the groove.

9. The display panel of claim 8, further comprising an auxiliary partition wall located on both sides of the groove of the second insulating layer.

10. The display panel of claim 9, wherein the auxiliary partition wall comprises a same material as a material of the upper insulating layer.

11. An electronic device comprising:
   a display panel comprising a transmissive area and a display area that surrounds the transmissive area; and
   a component located under the transmissive area of the display panel,
   wherein the display panel comprises:
      a substrate;

a plurality of pixels arranged on the substrate in the display area;
a first insulating layer arranged on the substrate and comprising an opening that overlaps the transmissive area;
a second insulating layer arranged on the first insulating layer and comprising a groove;
an encapsulation substrate covering the plurality of pixels; and
a filling layer arranged between the substrate and the encapsulation substrate in the transmissive area and overlapping the groove.

12. The electronic device of claim 11, wherein a depth of the groove is less than a thickness of the second insulating layer.

13. The electronic device of claim 11, wherein the display panel further comprises plurality of data lines electrically connected to the plurality of pixels,
wherein at least one of the plurality of data lines comprises a bypass portion that bypasses a periphery of the transmissive area, and
wherein the bypass portion is located under the groove.

14. The electronic device of claim 13, wherein the display panel further comprises a conductive layer that overlaps the bypass portion, and
wherein the groove overlaps the conductive layer.

15. The electronic device of claim 11, wherein the filling layer comprises a silicon-based adhesive material.

16. The electronic device of claim 11, wherein each of the plurality of pixels includes a light emitting diode, and
wherein the light-emitting diode comprises:
a first electrode;
an intermediate layer arranged on the first electrode; and
a second electrode, wherein at least a part of the second electrode covers the plurality of pixels, and
wherein the display panel further comprises an upper insulating layer that covers an edge of the first electrode of the light-emitting diode.

17. The electronic device of claim 16, wherein the display panel further comprises an auxiliary partition wall located on both sides of the groove of the second insulating layer.

18. The electronic device of claim 17, wherein the upper insulating layer comprises a first opening that overlaps the first electrode and a second opening that overlaps the transmissive area, and
wherein an edge of the upper insulating layer defining the second opening is closer to the display area than the auxiliary partition wall.

19. The electronic device of claim 17, wherein each of the groove and the auxiliary partition wall has a closed loop shape surrounding the transmissive area in a plan view.

20. The electronic device of claim 11, wherein the component comprises a sensor or a camera.

* * * * *